United States Patent [19]

Nagai

[11] Patent Number: 5,717,239
[45] Date of Patent: Feb. 10, 1998

[54] MOS TRANSISTOR WITH LARGE GATE WIDTH

[75] Inventor: Takayuki Nagai, Tokyo, Japan

[73] Assignee: NEC Corporation, Tokyo, Japan

[21] Appl. No.: 749,646

[22] Filed: Nov. 15, 1996

[30] Foreign Application Priority Data

Nov. 15, 1995 [JP] Japan .................................. 7-295874

[51] Int. Cl.$^6$ ........................................ H01L 29/06
[52] U.S. Cl. .................. 257/365; 257/374; 257/397; 257/401; 257/404
[58] Field of Search ............................... 257/401, 622, 257/365, 397, 374, 404

[56] References Cited

FOREIGN PATENT DOCUMENTS

| | | | |
|---|---|---|---|
| 61-61438 | 3/1986 | Japan . | |
| 1061068 | 3/1989 | Japan | 257/622 |
| 2003976 | 1/1990 | Japan | 257/401 |
| 4250668 | 9/1992 | Japan | 257/401 |
| 5347410 | 12/1993 | Japan | 257/401 |

*Primary Examiner*—William Mintel
*Attorney, Agent, or Firm*—Young & Thompson

[57] ABSTRACT

In a MOS transistor device, the gate width is effectively enlarged without increasing the occupied area of the transistor by forming a plurality of rectangular grooves in the direction perpendicular to the gate width, and filling in these rectangular grooves with a gate electrode. Since these grooves are formed by anisotropic etching, there is no risk of contaminating the wafer.

4 Claims, 8 Drawing Sheets

MOS TRANSISTOR WITH LARGE GATE WIDTH

BACKGROUND OF THE INVENTION

1. Field of the Invention

The present invention relates to a semiconductor device, and more particularly to a semiconductor device having a MOS transistor.

2. Description of the Prior Art

Figure 1A:
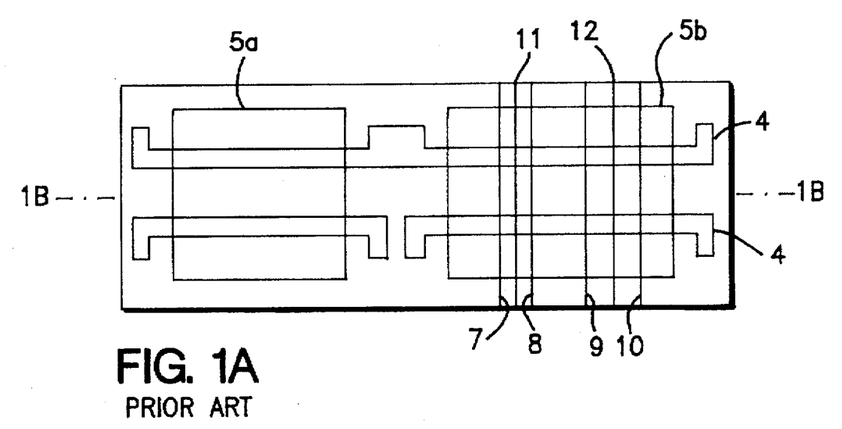
FIG. 1A is a plan view showing a conventional MOS transistor.
Figure 1B:
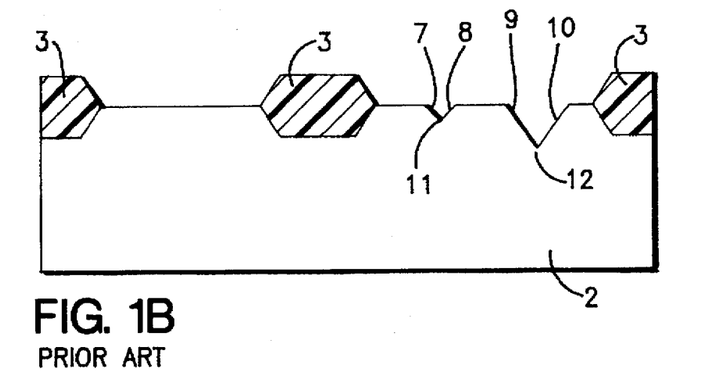
FIG. 1B is its sectional view along line 1B—1B in FIG. 1A.
Figure 2A:
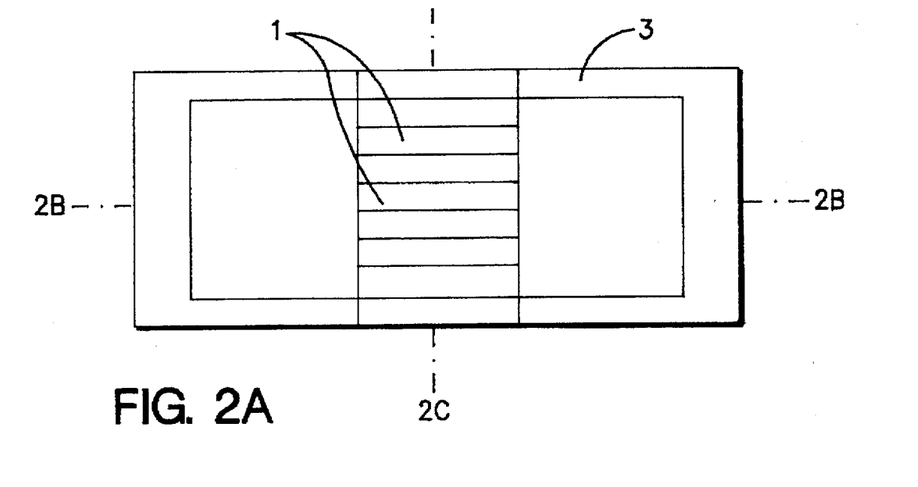
FIG. 2A is a plan view showing a first embodiment of the semiconductor device according to this invention.
Figure 2B:
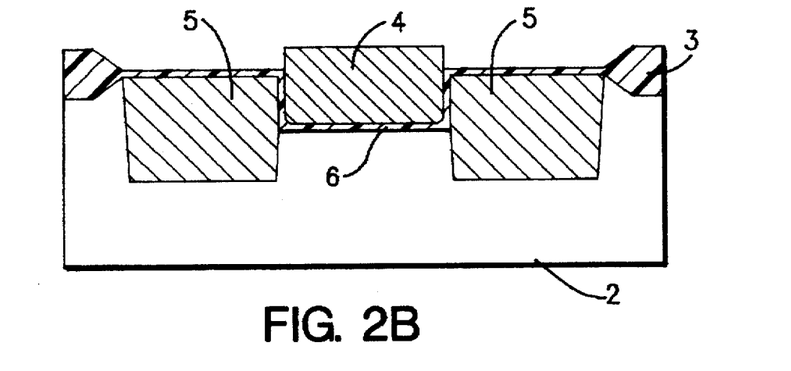
FIG. 2B is its sectional view along line 2B—2B in FIG. 2A.
Figure 2C:
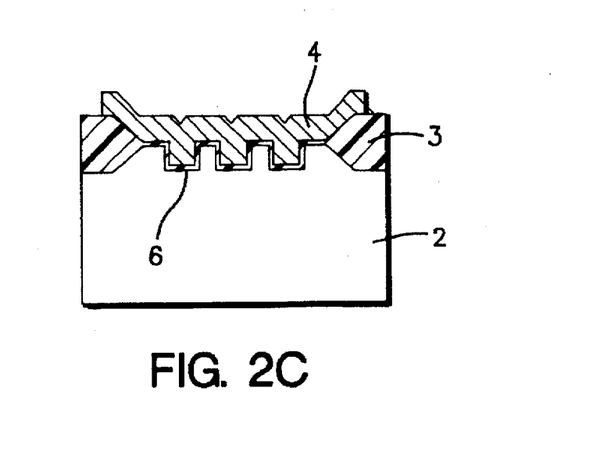
FIG. 2C is its sectional view along line 2C—2C in FIG. 2A.

An example of conventional semiconductor devices of the above kind is shown in FIGS. 1A and 1B in Japanese Unexamined Patent Application No. 61-61438 (1986). FIG. 1A is its plan view and FIG. 1B is its sectional view along line 1B—1B in FIG. 1A.

In FIGS. 1A and 1B, V-shaped grooves 11 and 12 are formed in the direction perpendicular to the width of a gate electrode 4 in order to enhance the driving capacity of a MOS transistor without increasing the occupied area. By means of these V-shaped grooves 11 and 12 it is possible to essentially increase the channel width of the MOS transistor. In other words, since channels are formed along respective wall faces 7 to 10 of the V-shaped grooves 11 and 12, it is possible to effectively enlarge the channel width.

It should be mentioned in FIGS. 1A and 1B that 2 is a semiconductor substrate, 3 is an LOCOS film for isolating elements in the field region, and 5a and 5b show respective boundaries of active regions of two MOS transistors.

The side walls 7 to 10 of the V-shaped grooves 11 and 12 with a slope of 54.7° can be formed by, for example, etching the (100) plane of silicon with a KOH aqueous solution. With this procedure, it is possible to enlarge the gate width of the MOS transistor to a value which is $1/\cos 54.7° = 1.73$ times, at the most, that of the case with no grooves.

For the conventional structure as shown in FIGS. 1A and 1B, it is difficult to employ a dry etching method to form the V-shaped grooves 11 and 12, and there is no other means than to adopt a wet etching method. However, wet etching has an inferior controllability compared with dry etching, in addition to its causing some apprehension about contamination of the semiconductor wafer. Besides, it is capable of enlarging the gate width by a factor of only 1.73 at the most.

SUMMARY OF THE INVENTION

It is the object of the present invention to provide a semiconductor device which eliminates the risk of contamination of the semiconductor wafer and makes it possible to drastically enlarge the effective gate width.

A semiconductor device according to this invention has a feature in that rectangular grooves are formed in the direction perpendicular to the width of the gate between the source and the drain of the transistor.

Another semiconductor device according to this invention has a feature in that a rectangular groove is formed on the channel region between the source and the drain in the direction parallel to the direction of a current in the channel. Moreover, it is characterized in that a plurality of rectangular grooves are formed mutually parallel, and that these rectangular grooves are formed by an anisotropic dry etching.

The function of this invention is to make it possible, substantially, to enlarge the gate width of the MOS transistor by providing grooves with rectangular cross-section, formed in the channel region of the transistor by means of an anisotropic dry etching, in the direction perpendicular to the gate width.

BRIEF DESCRIPTION OF THE DRAWINGS

FIGS. 3A, 3B and 3C are diagrams showing the semiconductor device after source and drain electrodes, a layer insulating film and a cover are formed for the device in FIGS. 2A–2C, where

FIGS. 4A to 4F and 5A to 5D are sectional views showing the manufacturing processes of the semiconductor device according to this invention, where

DESCRIPTION OF THE PREFERRED EMBODIMENTS

Referring to the drawings, the embodiments of this invention will be described in the following.

Figure 4A:
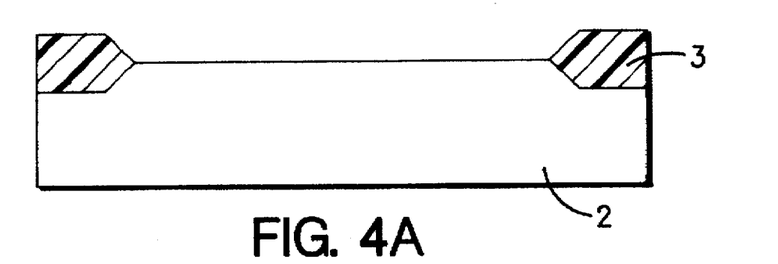
FIGS. 4A–4F are its sectional views along line 3B—3B in FIG. 3A, and FIGS. 5A–5D are its sectional views along line 3C—3C in FIG. 3A.
Figure 4B:
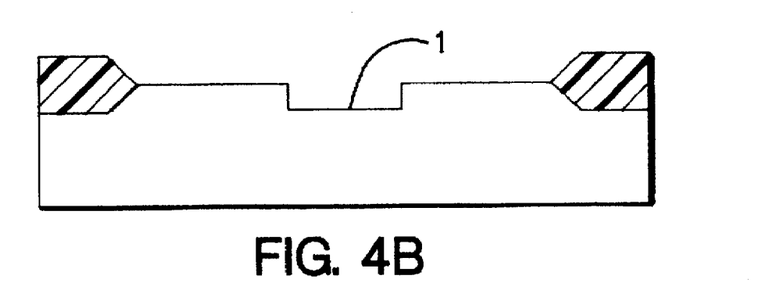
Figure 5A:
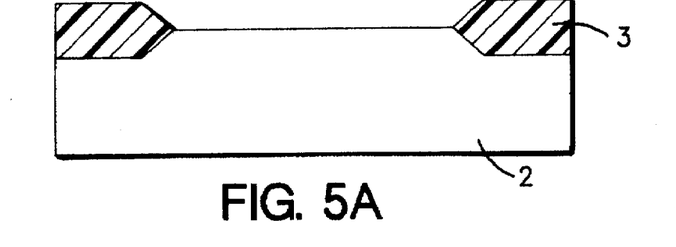
Figure 5B:
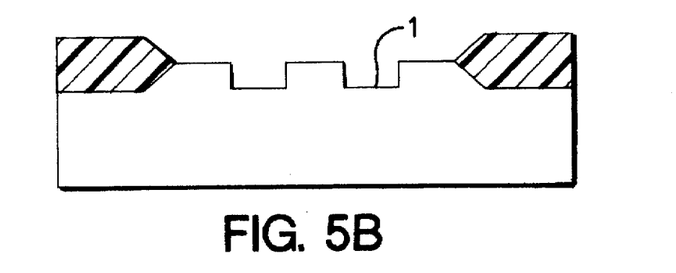

Referring to these drawings, first, an LOCOS film 3 with thickness of 6000–8000 Å for field element isolation is formed on a P-type semiconductor substrate with impurity concentration of (14–16)atoms/cm$^3$ (FIGS. 4A and 5A). Next, a groove 1 with depth of 0.01–2 μm is formed by anisotropic etching in the direction perpendicular to the gate width in the region of formation of the gate for a MOS transistor (FIGS. 4B and 5B). In this case, it is preferable to form a plurality of mutually parallel grooves 1 as shown in FIG. 5B.

The processing conditions of this anisotropic etching which uses a dry etching system are, for example, gas flow rates of 16 sccm for SiCl$_4$, 10 sccm for SF$_6$, 5 sccm for N$_2$, and 20 sccm for Ar, and a duration of 0.05 to 10 min at a pressure of 2.5 Pa. As a result of this anisotropic etching, rectangular grooves 1 with depth of 0.01–2 μm can be formed.

In this process, grooves 1 are formed only in the region below the gate electrode so that it is possible to prevent such a fault as current leakage due to crystal defects in the source and drain region.

Figure 4C:
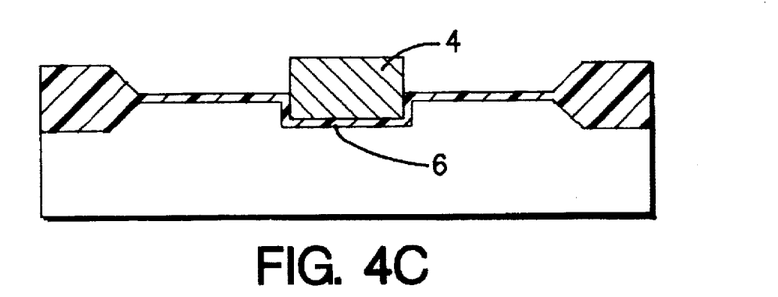
Figure 5C:
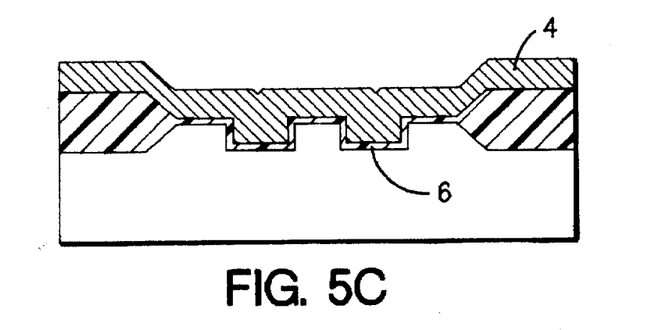

Next, a gate oxide film 6 with thickness of 400–1000 Å is formed, and polysilicon which is to become a gate electrode 4 is deposited on top of it. Then, the gate electrode 4 is formed by selectively etching the polysilicon (FIGS. 4C and 5C). In this process, the polysilicon for the gate electrode 4 is deposited on the side faces and the bottom surfaces of the rectangular grooves 1 to form a structure which fills in the interior of the grooves, thus effectively increasing the gate width.

Figure 4D:
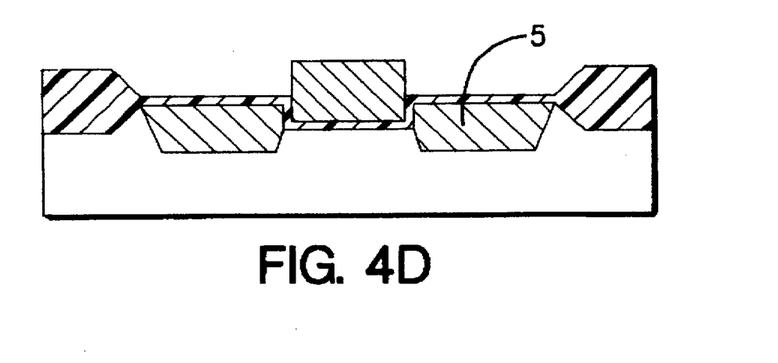

Following that, the active region (the source and the drain region) of the MOS transistor is produced by forming a diffused layer 5 with impurity concentration of 19–22 atoms/ cm³ (FIG. 4D). In this way, grooves with rectangular cross-section are formed in the direction parallel to the direction of a current (direction perpendicular to the gate width) flowing in the channel between the source and the drain regions in the active region of the MOS transistor.

In a transistor thus formed, it is possible to freely enlarge the gate width by setting the number and the depth of the grooves. In contrast to the conventional V-shaped grooves shown in FIGS. 1A and 1B, rectangular grooves by anisotropic etching according to this invention are formed only in the region directly below the gate electrode, so that there is no risk of wafer contamination, and a gate width increase of greater extent becomes possible.

For example, when the field width is 15 µm, and the gate grooves are formed 1 µm apart with opening width of 1 µm and depth of 1 µm, the total number of the gate grooves is 7, and hence the effective gate width is given by ---
(length of the portions with no grooves) +
(length of side faces of the grooves) +
(length of bottom surfaces of the grooves)
= (1 µm × 8) + {(1 µm + 1 µm) × 7} + (1 µm × 7)
= 29 µm.
---

Accordingly, the gate width can be enlarged to 29/15= 1.93 times the value without the grooves. The gate width can further be enlarged by increasing the spacing between the grooves and the depth of the grooves.

Figure 3A:
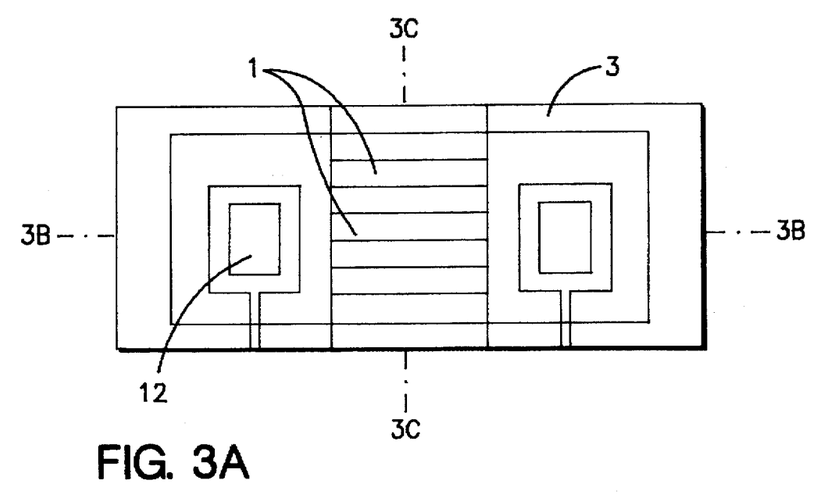
FIG. 3A is its plan view.
Figure 3B:
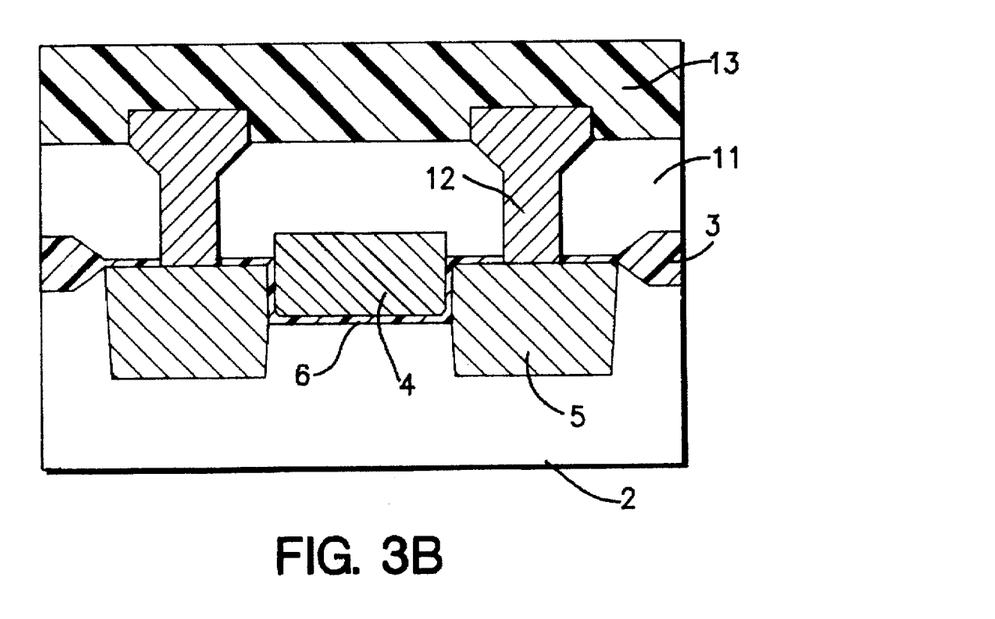
FIG. 3B is its sectional view along line 3B—3B in FIG. 3A.
Figure 3C:
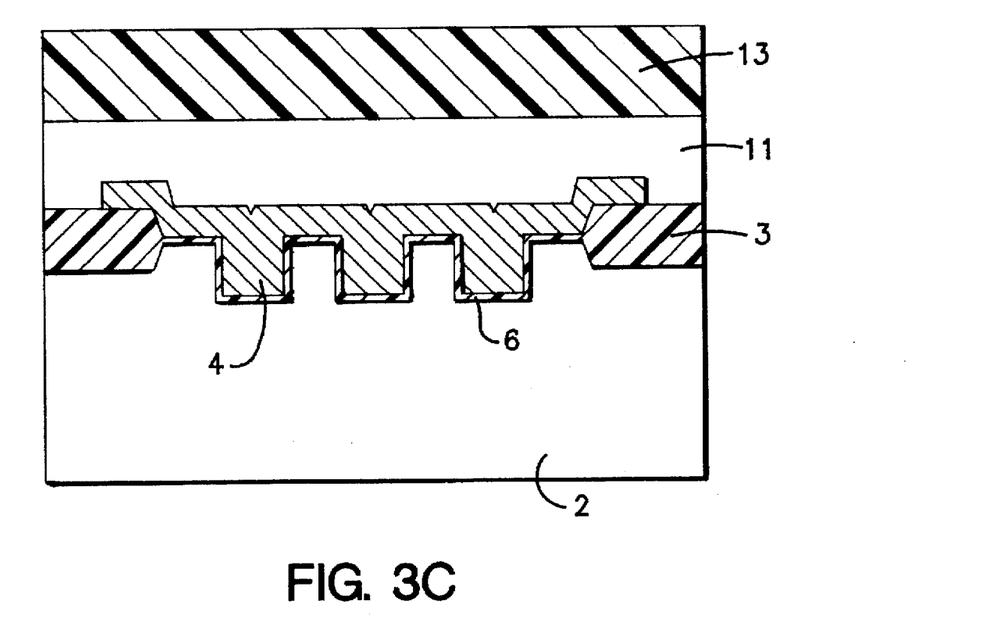
FIG. 3C is its sectional view along line 3C—3C in FIG. 3A.
Figure 4E:
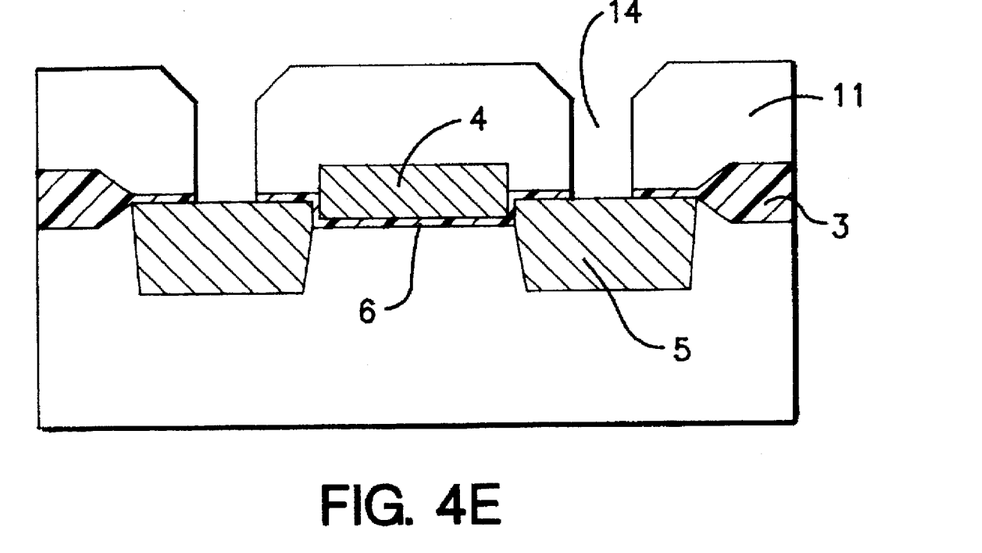
Figure 4F:
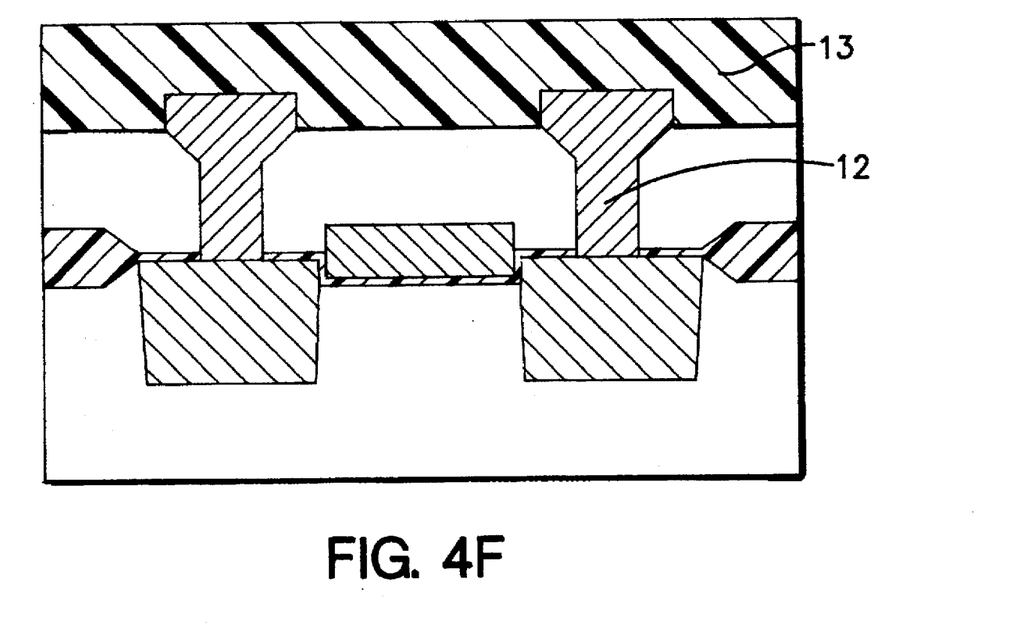
Figure 5D:
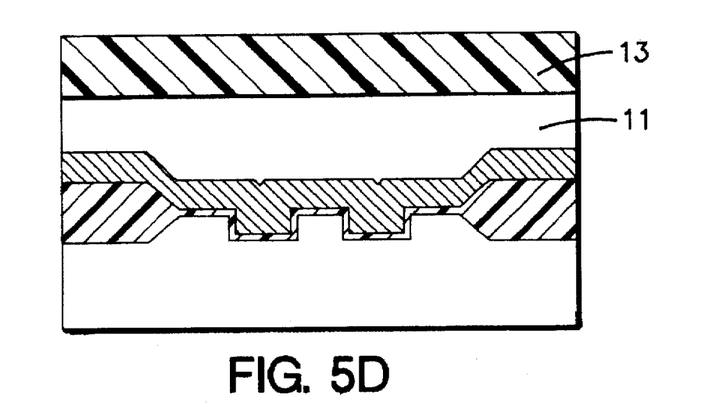
Figure 6A:
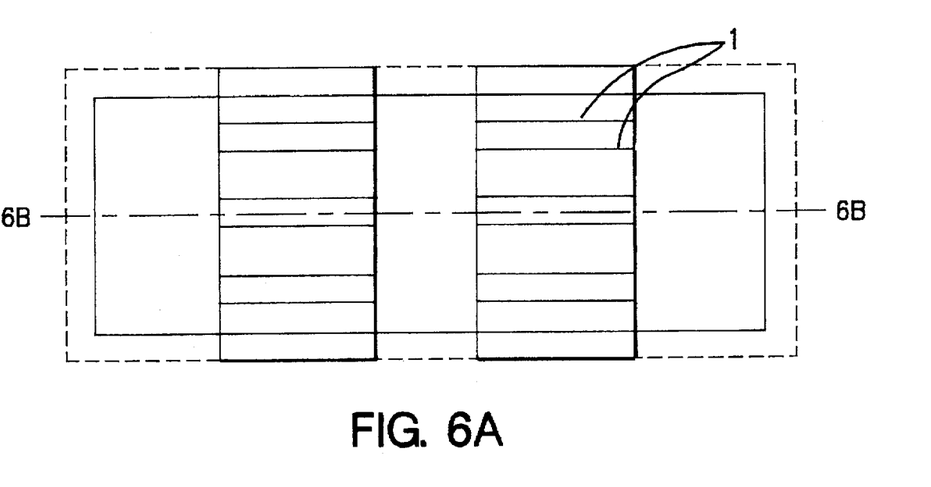
FIG. 6A is a plan view showing another embodiment of the semiconductor device according to this invention.
Figure 6B:
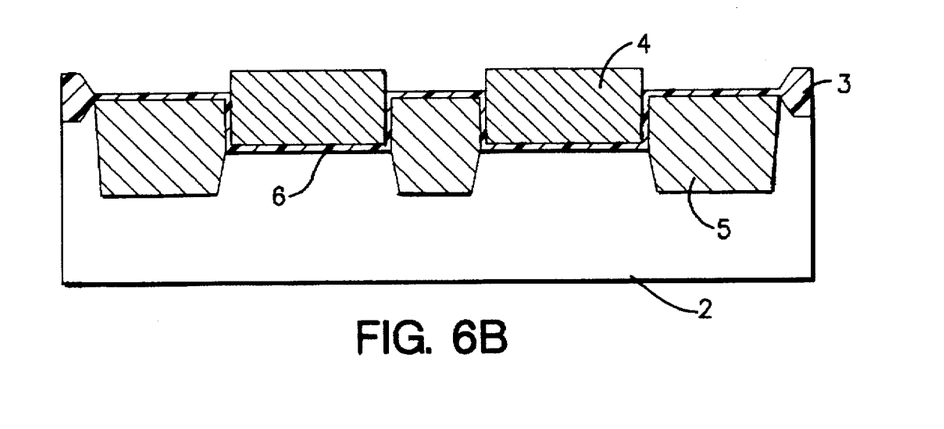
FIG. 6B is its sectional view along line 6B—6B in FIG. 6A.
Figure 7A:
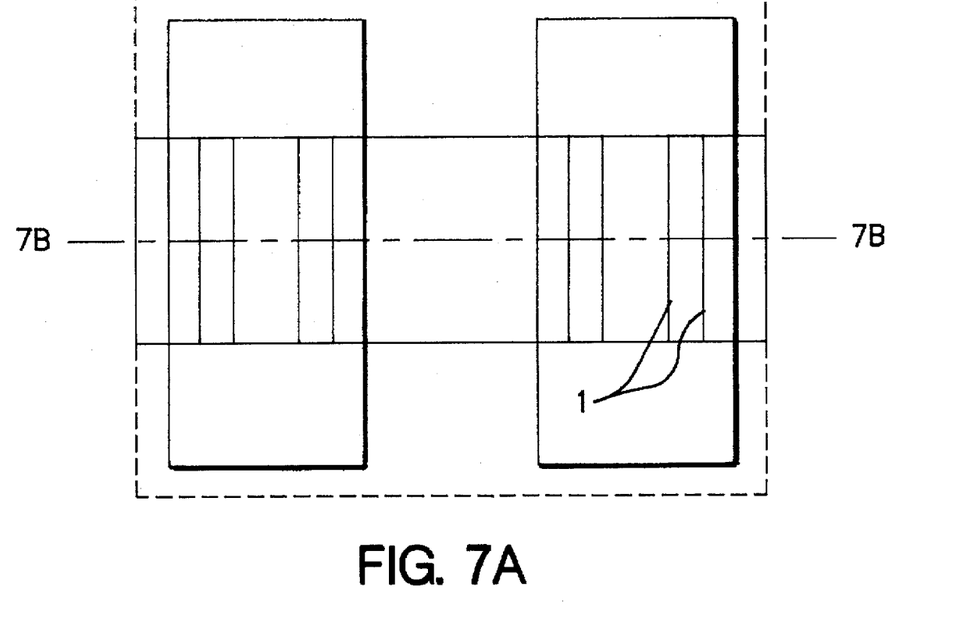
FIG. 7A is a plan view showing still another embodiment of a semiconductor device according to this invention.
Figure 7B:
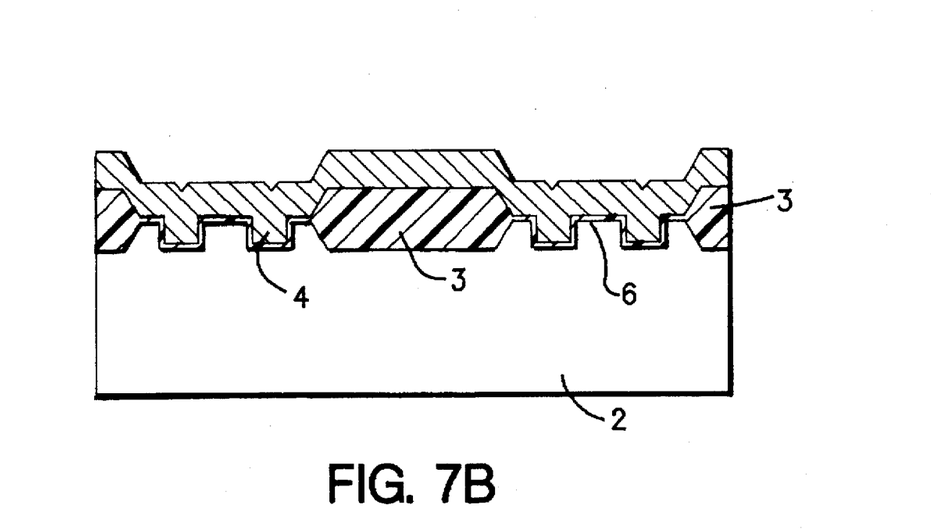
FIG. 7B is its sectional view along line 7B—7B in FIG. 7A.

Following the above, a layer insulating film 11 is formed as shown in FIG. 4E, contact holes 14 are opened above the source and drain region, and contacts 12 as shown in FIG. 4F are formed. Then, by forming a cover 13 as shown in FIGS. 4F and 5D, the semiconductor device shown in FIGS. 3A, 3B and 3C is completed. Here, it is preferable to use a plasma oxide film for the layer insulating film 11 and an oxide film for the cover 13.

FIGS. 6A and 6B, and FIGS. 7A and 7B are diagrams showing other embodiments of the semiconductor device according to this invention, which show the structures in which a plurality of MOS transistors with rectangular grooves formed directly below the gate electrode are formed on a single substrate.

As described in the above, according to this invention, there is obtained an effect of forming a semiconductor device with further increased gate width having an excellent controllability and no risk of contamination of the wafer, because of the adoption of anisotropic dry etching.

What is claimed is:

1. A semiconductor device comprising a source region and a drain region formed in a semiconductor substrate to define a channel region therebetween, a gate insulating film formed on said channel region, a gate electrode formed on said gate insulating film, and a plurality of rectangular grooves formed in said channel region apart from each other.

2. A semiconductor device as claimed in claim 1, wherein said rectangular grooves are formed by an anisotropic dry etching.

3. A semiconductor device as claimed in claim 2, wherein said rectangular grooves are filled with said gate electrode with said gate insulating film therebetween.

4. A semiconductor device as claimed in claim 2, wherein said rectangular grooves are formed in parallel to each other in a direction of a gate length.

* * * * *